United States Patent [19]

Liu et al.

[11] Patent Number: 4,978,627

[45] Date of Patent: Dec. 18, 1990

[54] METHOD OF DETECTING THE WIDTH OF LIGHTLY DOPED DRAIN REGIONS

[75] Inventors: Yow-Juang Liu, San Jose; Zahra Hadjizadeh-Amini, Cupertino, both of Calif.

[73] Assignee: Advanced Micro Devices, Inc., Sunnyvale, Calif.

[21] Appl. No.: 443,886

[22] Filed: Nov. 30, 1989

Related U.S. Application Data

[63] Continuation-in-part of Ser. No. 313,984, Feb. 22, 1989.

[51] Int. Cl.$^5$ .................... H01L 21/66; H01L 21/265
[52] U.S. Cl. ........................................ 437/44; 437/8; 437/41
[58] Field of Search ................... 437/8, 41, 44, 235, 437/238, 149, 153, 154, 30, 34, 57; 357/23.3, 23.9, 23.11, 91

[56] References Cited

U.S. PATENT DOCUMENTS

| | | | |
|---|---|---|---|
| 4,282,648 | 8/1981 | Yu et al. | 437/34 |
| 4,366,613 | 1/1983 | Ogura et al. | 437/30 |
| 4,419,809 | 12/1983 | Riseman et al. | 437/41 |
| 4,488,351 | 12/1984 | Momose | 437/34 |
| 4,503,601 | 3/1985 | Chiao | 437/29 |
| 4,577,391 | 3/1986 | Hsia et al. | 437/36 |
| 4,642,878 | 2/1987 | Maeda | 437/34 |
| 4,709,467 | 12/1987 | Liu | 437/30 |
| 4,728,617 | 3/1988 | Woo et al. | 437/44 |
| 4,735,680 | 4/1988 | Yen | 156/643 |
| 4,818,714 | 4/1989 | Haskell | 437/44 |
| 4,843,023 | 6/1989 | Chiu et al. | 437/34 |
| 4,855,247 | 8/1989 | Ma et al. | 437/44 |

FOREIGN PATENT DOCUMENTS

| | | |
|---|---|---|
| 0218408 | 4/1987 | European Pat. Off. |
| 0211267 | 11/1985 | Japan . |
| 0257231 | 10/1988 | Japan . |

OTHER PUBLICATIONS

Huang, "Using the Cross—Bridge Structure to Monitor the Effective Oxide Sidewall—Spacer Width in LDD Transistors", IEEE Electron Device Letters, vol. EDL—6, No. 5, May 1985, pp. 208–210.

Tsang et al., "Fabrication of High—Performance LDDFETs with Oxide Sidewall—Spacer Technology", IEEE Trans. on Electron Devices, vol. ED—29, No. 4, Apr. 1982, pp. 590–596.

Bril et al., "Electrical Measurements of Sidewall Spacer Dimensions", Proc. SPIE Int. Soc. Opt. Eng., 1985, vol. 565, pp. 117–120.

Pfiester, "LDD MOSFET's Using Disposable Sidewall Spacer Technology", IEEE Electron Device Letters, vol. 9, No. 4, Apr. 1988, pp. 189–192.

Wolf et al., Silicon Processing for the VLSI Era, vol. 1: Process Technology, Lattice Press, 1986.

Ghandhi, VLSI Fabrication Principles, John Wiley and Sons, 1983, pp. 548–550.

Primary Examiner—Olik Chaudhuri
Assistant Examiner—M. Wilczewski
Attorney, Agent, or Firm—Fliesler, Dubb, Meyer & Lovejoy

[57] ABSTRACT

A process for fabricating field effect transistors with lightly doped drain (LDD) regions having a selected width includes a method of optically detecting the width of spacers used to mask the LDD regions during the source and drain implant and a method of electrically determining (confirming) the width of the LDD regions. In the optical method, reference structures are formed concurrently with the fabrication of the gates for FETs, a spacer material is formed on the substrate, the gates and the reference structures, the spacer material is etched away and the width of the spacers is optically detected by aligning the edges of spacers extending from two reference structures separated by a known distance. In the electrical method, the width is determined by defining a test area with known dimension, forming both N+ and N− regions in the test area, measuring the resistance across the test area, calculating the resistance of the N+ and N− regions, and calculating the width of the N− region from the resistance of the N− region. The electrically determined width is compared with the desired LDD region width, and the difference between the electrically determined width and the desired width is used to adjust the distance between the reference structures for a subsequent processing run.

20 Claims, 4 Drawing Sheets

METHOD OF DETECTING THE WIDTH OF LIGHTLY DOPED DRAIN REGIONS

CONTINUATION APPLICATION INFORMATION

This application is a continuation-in-part of copending application Ser. No. 313,984, filed Feb. 22, 1989.

BACKGROUND OF THE INVENTION

1. Field of the Invention

The present invention generally relates to the fabrication of field effect transistor (FET) structures and particularly to the fabrication of field effect transistor structures with lightly-doped drain (LDD) regions. More specifically, the present invention relates to a method for in-line monitoring of the width of lightly-doped drain regions in the fabrication of lightly-doped drain field effect transistors and offline electrical measurements of the width of the lightly-doped drain regions.

2. Description of the Related Art

Lightly-doped drain (LDD) regions have commonly been used in reducing the length of the channel region in a FET, thereby reducing the size of transistors. The reduction in the length of the channel region is made possible by LDD regions which separate the drain and source regions from the channel region, and thus increase the channel breakdown voltage and reduce electron impact ionization (hot electron effects) by reducing the electric field at the source and drain pinch-off regions.

FETs having LDD regions are typically fabricated by first implanting regions at both ends of a gate with a light dose of an N-type dopant, thereby defining a channel between two N$^-$ regions. A spacer (or mask) is then formed over portions of the N$^-$ regions adjacent to the gate structures. Thereafter, a second implant is performed with a heavier dose of an N-type dopant to form N$^+$ source and drain regions. The spacer masks the underlying N$^-$ regions during the second implantation so that these regions become the LDD regions Thus, the width of the spacers defines the width of the LDD regions.

While the channel breakdown voltage of a LDD FET and its ability to resist hot electron effects can be increased by increasing the width of the LDD regions, the LDD regions can increase the resistance of the transistor channel and degrade the current drive capability of the FET. Consequently, it is important to control the fabrication process so that an optimum LDD width is achieved.

To control the fabrication process, it is desirable to have a convenient method of monitoring the width of the spacers which mask the N$^-$ regions during the source and drain implant. Two methods are conventionally utilized:

The width of the insulators can be observed cross-sectionally with a scanning electron microscope (SEM). However, this technique, which involves a destructive cleaving of a sample which is then viewed with a SEM, is slow, tedious and cannot be used inline in the fabrication process. The number of samples examined is relatively small because of the inconvenience and the destructive nature of the test. Moreover, the accuracy of this method is limited by the resolution of the SEM.

An electrical method for measuring the width of LDD insulators is described in "Using The Cross-Bridge Structure To Monitor The Effective Oxide Sidewall-Spacer Width in LDD Transistors," by T. Y. Huang, IEEE Electron Device Letters, Vol. EDL-6, No. 5, May 1985, pages 208-210. In this method, the insulator width is determined by measuring the resistance of a region created in a process-monitor wafer having a crossbridge test pattern. In order not to obscure the width information of the cross-bridge test pattern, the N$^-$ implant, which is normally required for LDD formation, is deliberately skipped in the process monitor wafer. Therefore, the method must be practiced on a separate test wafer and cannot be used in-line.

SUMMARY OF THE INVENTION

It is therefore, an object of the invention to provide a method of monitoring the width of LDD regions in a FET which can be integrated into the FET fabrication process.

A further object of the present invention is to provide a non-destructive method of monitoring the width of spacers used to mask LDD regions.

Another object of the present invention is to provide a method of optically monitoring the width of spacers used to mask LDD regions and electrically confirming the width of the resulting LDD regions.

Another object of the present invention is to provide a method of determining the width of LDD regions fabricated in a first fabrication run and adjusting the process parameters for a second fabrication run based on the width achieved in the first fabrication run.

These and other objects of the present invention are achieved by the combination of an in-line optical measurement technique and off-line electrical measurement technique for determining the width of LDD regions. A target LDD width is determined in accordance with desired performance and reliability characteristics and reference structures used in the optical technique are selected on the basis of the target LDD width. The optical measurement technique is used during a first fabrication run, and the electrical measurement technique is used to determine the width of LDD regions formed during the first fabrication run. The results of the electrical measurements are compared with the target LDD width. The distance between the reference structures used with the optical technique during a second fabrication run are selected based on this comparison and a second fabrication run is performed utilizing the adjustments made after the first fabrication run.

A method, in accordance with the present invention, of fabricating, in a substrate, a field effect transistor including lightly-doped drain regions having a target width, comprises the steps of: (a) forming reference structures separated by a distance y which is approximately twice the target width on the substrate and forming a gate structure on the substrate; (b) forming lightly-doped drain regions self-aligned with the ends of the gate structure in the substrate; (c) forming a layer of spacer material on the substrate; (d) etching the layer of spacer material to form spacers extending laterally from the ends of the gate structure and from the reference structures; (e) determining when spacer extending from each reference structure has a width approximately equal to half of the distance between the reference structures; (f) forming source and drain regions self-aligned with the spacers in selected portions of the lightly-doped drain regions; (g) electrically detecting the width z of the spacers, by: (i) measuring the sheet resistance, $R_{SN-}$, of the substrate due to the first implant dosage, (ii) measuring the sheet resistance, $R_{sn+}$, of the substrate due to the combination of the first and second implant dosages, (iii) measuring the resistance, R, of the test region, and (iv) calculating the width of the spacers and thus the lightly-doped drain regions based upon the measured resistance values; (h) comparing the target width and the width z of the spacers calculated in step (g); and (i) repeating steps (a) through (f) with a distance y selected based on the comparison in said step (h).

DESCRIPTION OF THE PREFERRED EMBODIMENTS

A process of fabricating N-channel field effect transistors with lightly-doped drain regions will be described to illustrate how the present invention can be used to optionally monitor the width of spacers used to mask LDD regions during an implant which forms source and drain regions self-aligned with the spacers and to electrically determine the width of the resulting lightly-doped drain regions.

In one aspect of the invention, at least two reference structures separated by a known distance are formed on the substrate. Spacers extending from the reference structures are formed concurrently with the formation of spacers extending from the gate structures. The width of the spacers is monitored by optically determining when the spacers extending laterally from the reference structures are aligned. The width of each spacer is then equal to half the distance between the pair of reference structures. Preferably, several pairs of reference structures are formed with known, different distances between the reference structures of each pair. The width of the spacers is detected by locating a pair of reference structures for which the edges of the spacers are best aligned.

In another aspect of the invention, two parallel reference structures are formed to define a substantially rectangular test region, having a known length and width, between the reference structures. Undergoing the same or similar process steps as the field effect transistors, the test region is submitted to a first dopant implant to form $N^-$ regions self-aligned with the reference structures. Spacers are then formed to extend from the reference structures, and the test region is submitted to a second dopant implant to form and $N^+$ region between the two N-regions masked by the spacers. The width of the N-regions is calculated from measurements of the sheet resistance of the substrate after the first dopant implant, the sheet resistance of the substrate after the second dopant implant, and the resistance across the test region.

The distance between the reference structures used in the first aspect of the present invention is then compared with the width of the N− regions as calculated by the measurement technique of the second aspect of the invention. The comparison of these values is used to select the spacing of the reference structures for a subsequent fabrication run.

Figure 1A:
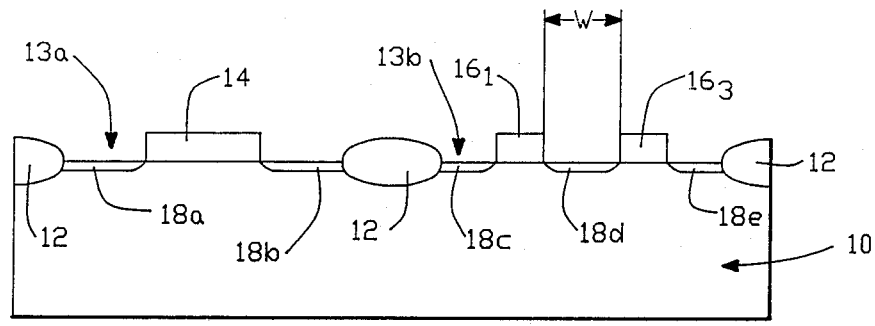
FIGS. 1A-1C are cross-sectional views of a FET having lightly-doped drain field effect transistors in various stages of fabrication in accordance with the method of the present invention.

These methods of monitoring and/or detecting the width of spacers and LDD regions formed utilizing the spacers during the fabrication of a FET will be described with reference to FIGS. 1-4. A substrate (a wafer) 10 doped with a background of P-type impurities (e.g., boron) is shown in FIG. 1A. Using conventional fabrication techniques, field oxide regions 12 are formed on the wafer to define active regions 13a, b. Using conventional fabrication techniques, a gate structure 14 is formed in active region 13a where a FET is to be provided. Reference structures $16_1$ and $16_3$ are formed in active region 13b. Reference structures $16_1$ and $16_3$ may be formed utilizing the same process steps utilized in the formation of the gate structure 14. Accordingly, the reference structures $16_1$, $16_3$ may be formed concurrently with the formation of the gate structure 14. Alternatively, reference structures $16_1$, $16_3$ may be formed using another process that will mask the substrate 10 during subsequent ion implantation steps.

An N-type dopant is implanted to form lightly doped regions 18a-e. The implant dosage is selected so that lightly doped regions 18a-e have $N^-$ electrical characteristics. The N-type dopant used to implant lightly doped regions 18a-e may be, for example, phosphorous or antimony, and the implant dosage may be, for example, $1 \times 10^{13} cm^{-2}$. Portions of lightly doped regions 18a-e will become the LDD regions of the FET formed in active region 13a.

Figure 1B:
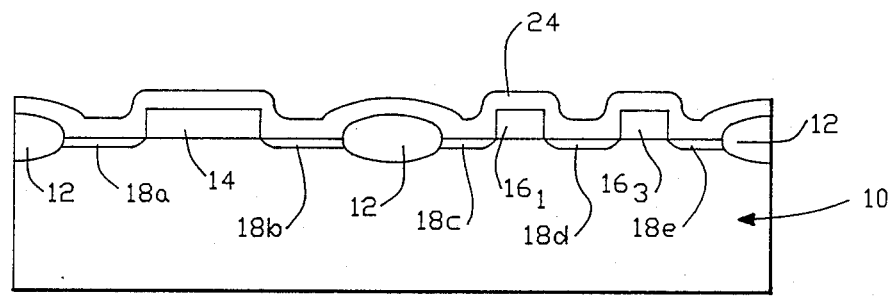
Figure 2A:
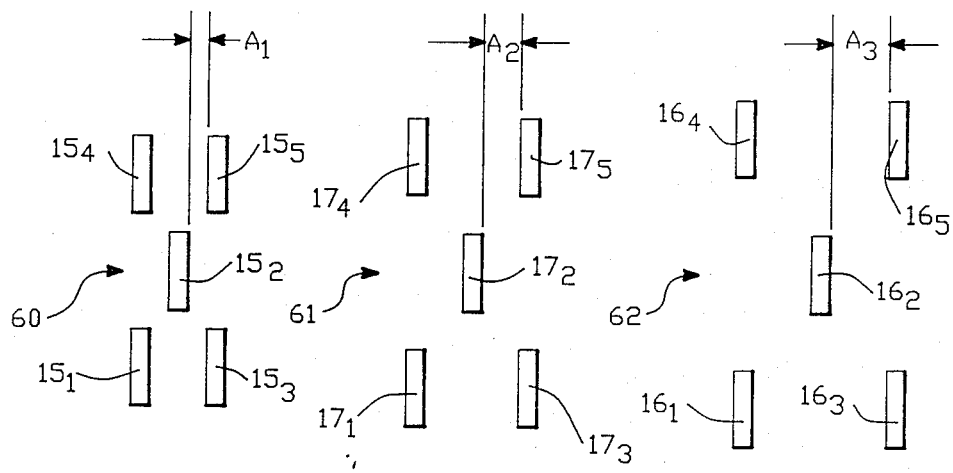
FIGS. 2A-B and 3A-B are plan views of different patterns of reference structures for use in the method of the present invention.
Figure 2B:
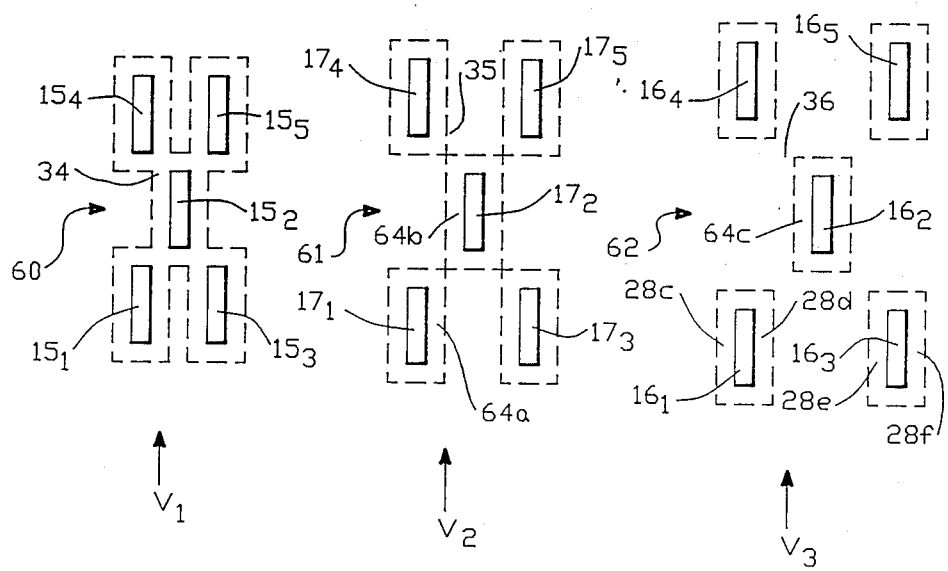

With reference to FIG. 1B, a layer of a spacer material 24 is formed over the exposed portions of substrate 10, field oxide regions 12, and over gate structure 14 and references structures $16_1$ and $16_3$. The spacer material layer 24 may be any material for which an etchant can be provided which removes the spacer material in a selectively controlled manner. Examples of the spacer material include oxides of silicon deposited using conventional chemical vapor deposition (CVD) techniques. Then, spacer material layer 24 is etched until only spacers 28a-f remain at the ends of gate structure 14 and at the edges of the reference structures $16_1$, $16_3$. Reactive ion etching (RIE) is one example of an etching process which may be used to etch spacer material layer 24. As shown in FIGS. 2A-B, reference structures $16_1$ and $16_3$ are preferably offset so that when viewed along the direction of arrows $V_1$-$V_3$ it is possible to determine when the spacers extending from the reference structures have aligned edges. FIGS. 2A and 2B illustrate three groups of reference structures 60-62. In FIG. 2B spacers 64a, b, extending from reference structures $17_1$, $17_2$, respectively, have aligned edges. Spacers 28d and 64c extending from reference structures $16_1$ and $16_3$ are examples of spacers having edges which are not aligned.

The use of reference structures, e.g., structures $16_1$ and $16_3$, to monitor and determine the width of spacers 28a-f will be described with reference to FIGS. 1-4. Lightly doped regions 18a-e are self-aligned with gate structure 14 and reference structure $16_1$, $16_2$. After the formation of spacers 28a-f, N-type dopant ions are implanted using gate structure 14, reference structures $16_1$, $16_3$, and spacers 28a-f as masks to form N regions 30, 32, 40 in the portions of lightly doped regions 18a–e which are not masked by spacers 28a–f. The dosage for the second implant is approximately two orders of magnitude greater than the dosage used to implant lightly doped regions 18a–e, e.g., approximately $1 \times 10^{15} \text{cm}^{-2}$, and the N-type dopant may be, for example, arsenic. (The N-type dopants used in the first and second implants are selected to provide the resulting FET with selected characteristics; however, the particular N-type dopant selected is not related to or affected by the present invention.) The N+ regions 30, 32 formed by the second implant are the source and drain regions for the FET and are self aligned with spacers 28a and 28b, respectively. The portions of lightly doped regions 18a and b which are masked by spacers 28a, b become LDD regions 34 and 36. A channel region 38 is defined between LDD regions 34 and 36.

To provide in-line optical monitoring of the width of the spacers 28, several groups 60–62 of reference structures are fabricated on a portion of the substrate 10 (FIGS. 2A, B). Reference structures 15–17 may be formed on a field oxide region or any other region since reference structures 15–17 do not have to be provided on the substrate. The edges of the reference structures in each group are separated by predetermined distances. Reference structures $15_1$–$15_5$ in group 60 have edges separated by a distance $A_1$, reference structures $17_1$–$17_5$ in group 61 have edges separated by a distance $A_2$, and reference structures $16_1$–$16_5$ in group 62 have edges separated by a distance $A_3$.

The difference in the values of distances $A_1$–$A_3$ is dependent upon the precision required in monitoring the width of the spacers. For example, the values of $A_1$–$A_3$ may increase in 0.1 micron increments. Clearly, more than three groups of reference structures may be provided to establish a greater range of distances or to provide smaller increments for the same range of distances.

Figure 3A:
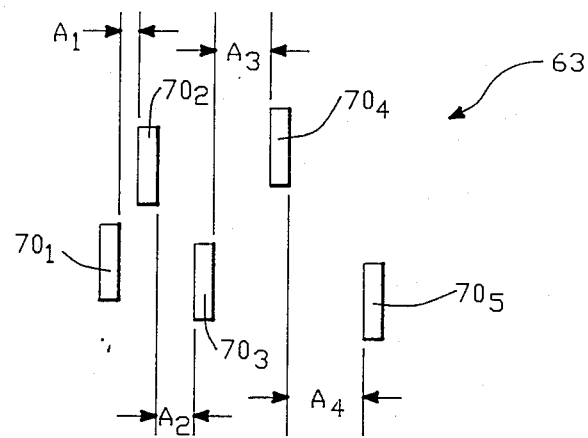
Figure 3B:
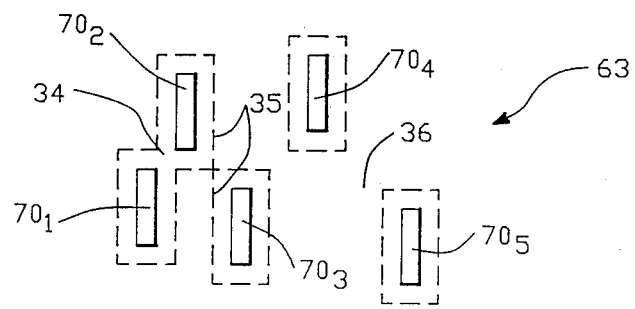

One pattern of spacers is illustrated in FIGS. 2A–B. Many alternate patterns of reference structures can be used to achieve the same purpose. One such alternate pattern is illustrated in FIGS. 3A–B in which the distance between reference structures $70_{1\text{-}5}$ of group 63 varies for each pair of reference structures. Reference structures $70_1$ and $70_2$ are separated by a distance $A_1$, reference structures $70_2$ and $70_3$ are separated by a distance $A_2$, reference structures $70_3$ and $70_4$ are separated by a distance $A_3$, and reference structures $70_4$ and $70_5$ are separated by a distance $A_4$.

Figure 1C:
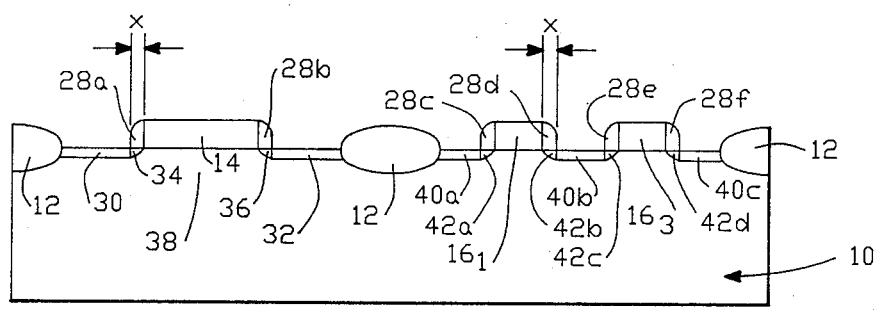

As the spacer layer 24 (FIG. 1B) is removed by etching, the portions of the spacer layer 24 at the edges of the gate 14 and the reference structures 15–17 remain, due to the increased thickness of these portions of the spacer layer 24, to form spacers 28, 64 extending laterally from the gate 14 and from the reference structures 15–17 (FIGS. 1C and 2B). The spacers extending from different groups of reference structures 60–62 will be aligned at different stages during the etching process. As shown in FIG. 2B, spacers 64a, b extending from reference structures $17_1$, $17_2$ are aligned when viewed along arrow $V_2$, thus, the width of each spacer is equal to $A_2/2$ (one-half of the distance between the spacers). If the spacers extending from reference structures $16_1$ and $16_2$ were aligned, each spacer would have a width equal to $A_3/2$. Note that the drawn distances $A_{1\text{-}3}$ should be compared with the actual distances between the reference structures as determined by measurements of the reference structures, e.g., optical measurements.

The distance between the reference structures used to perform the optical monitoring is selected to provide the FET with selected performance and reliability characteristics. The performance characteristics are based on the width of the LDD regions and include providing an LDD FET with a drain current reduction which is less than 10% of non-LDD FETs. Reliability for an LDD FET means reducing hot carrier injection; the target is 0.5 micro-amps per micron of LDD FET width. The optical monitoring technique is useful to establish the width of spacers 28; however, the width of LDD regions 34 is dependant on the lateral diffusion of the dopant ions after the implant is driven (or activated).

Figure 4A:
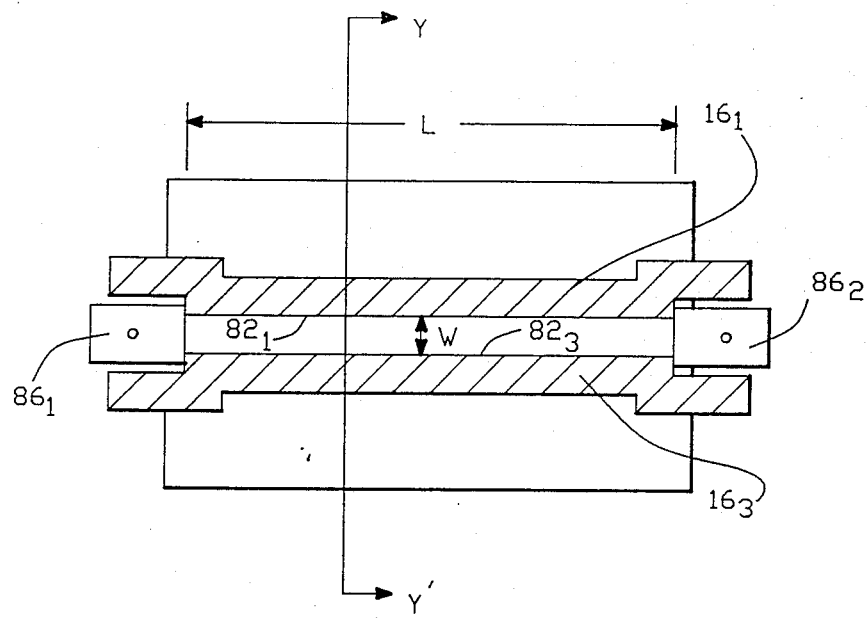
FIG. 4A is a plan view of a structure utilized in an electrical measurement to determine the width of spacers used to mask lightly-doped drain regions.
Figure 4B:
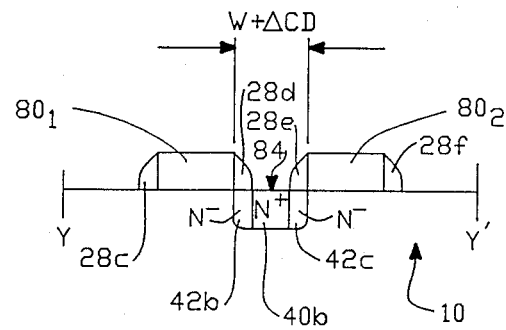
FIG. 4B is a cross-sectional view of the structures of FIG. 4A along line Y-Y'.

The electrical measurement technique measures the width of the LDD regions after the implant is driven, and thus the final LDD width. Electoral measurement for determining the width of the LDD regions are performed as follows. Two reference structures $16_1$, $16_3$, as illustrated in FIG. 4A, are formed on substrate 10. Reference structures $16_1$, $16_3$ have substantially parallel edges $82_1$, $82_3$ which define a rectangular test region 84 of known dimensions (length L and width W).

After reference structures $16_1$ and $16_3$ are formed, the first implant to form N− regions, as described above, provides an N− region 18d (FIG. 1B) in the entire test region 84. The first implant is also used to create a separate N− region (not shown) having known dimensions for control purposes. Spacers 28d, e are then fabricated and the second implant creates N+ region 40b self-aligned with spacers 28d, e and having a width W−2X, where X is the width of each of spacers 28d, e. The second implant is also used to provide a separate N+ control region (not shown) having known dimensions.

Contacts $86_{1\text{-}2}$ are formed at opposite ends of test region 84, and electrical resistance measurements are performed to detect the resistance R of test region 84. This resistance R is overall resistance of parallel resistances $R_{N-}$ of the N− regions 42b, c and $R_{N+}$ of N+ region 40b. Thus, the resistance R can be expressed as follows:

$$R = [(R_{N-})(R_{N+})]/[(R_{N+})] \quad (1)$$

The width of each spacer 28d, e is X. Thus, N+ region 40b has a width W-2X and the resistance $R_{N+}$ of N+ region 40b is:

$$R_{N+} = (R_{sN+})[L/(W + \Delta CD - 2X)] \quad (2)$$

where $\Delta CD$ is the difference between the drawn (intended) and actual widths of test region 84 and $R_{sN+}$ is the sheet resistance of the N+ region as determined using the N+ control region. Similarly, $R_{sN-}$ is the sheet resistance of the N− regions.

The combined resistance $R_{N-}$ of the two N− regions is $$R_{N-} = (R_{sN-})(L/2X) \quad (3)$$

The value of $\Delta CD$ can be found by measuring the resistance $R_1$ of a wide test area having width $W_1$ and length $L_1$, and the resistance $R_2$ of a narrow test area having width $W_2$ and length $L_2$. The sheet resistance $R_s$ of the structure is $R_s = R_1(W_1/L_1)$, and the value of $\Delta CD$ is: $\Delta CD = (R_s)(L_2/R_2) - W_2$ In general, the values of $\Delta CD$, $R_{sN}-$ and $R_{sN}+$ are available at the time of process evaluation and extra steps are not required to obtain these values.

From equations 1, 2, and 3, the resistance R is:

$$R = \frac{[L(R_{sN}+)(R_{sN}-)]}{\{WX[(R_{sN}+) - (R_{sN}-)] + [(W + \Delta CD)(R_{sN}-)]\}} \quad (4)$$

Rearranging the equation (4), to solve for the width X of the spacers yields the following result:

$$X = \tfrac{1}{2}\left(\frac{(R_{sN}-)}{(R_{sN}+) - (R_{sN}-)}\right)\left\{\left[\frac{L(R_{sN}+)}{R}\right] - (W + \Delta CD)\right\} \quad (5)$$

The results obtained by electorally determining the width X of LDD regions 34 may be compared with the distance between the reference structures 16 (half the distance since each spacer 28 has a width which is half of this distance) and with the desired width of the LDD regions. The value of half the distance between the reference structures and the electrically determined width may have differences caused by the effects of the diffusion of the $N^-$ and $N^+$ regions on the electrical measurements. The difference of the distance between the reference structures and the distance determined electrically is monitored from run to run to detect process variations.

The electrically determined width is compared with the desired LDD region width, and the difference between the electrically determined width and the desired width is used to adjust the distance between the reference structures for a subsequent processing run. The correction process based on the comparison of the desired width and the measured width of the LDD regions may be performed for each fabrication run and the following fabrication run.

Alternatively, if the optical technique is not used, the etching time used to form spacers 28 from spacer material layer 24 is selected for a first processing run and then adjusted for a subsequent processing run based on the electrical determination of the width of LDD regions formed during the first fabrication run. If the LDD regions are too wide, the etching time is increased. If the LDD regions are too narrow, the etching time is decreased.

Both the optical and electrical measurement techniques can be implemented without substantially altering the steps of a conventional fabrication process and without destroying the tested wafer. Moreover, the optical method can be performed in-line so that the width of the spacers can be adjusted for the wafer undergoing fabrication.

Many modifications and variations of the present invention are possible and contemplated in light of the above teachings. These modifications may include changes in the specific conductivity type of the substrate and regions formed therein, the specific impurities and concentration used, the material used for the gate and reference structures and specific fabrication techniques. Accordingly, the following claims are intended to cover all modifications and equivalents falling within the scope of the invention.

We claim:

1. A method of fabricating, in a substrate, a field effect transistor including lightly-doped drain regions having a selected width, comprising the steps of:
    (a) forming a pair of reference structures separated by a distance of twice the selected width on the substrate and forming a gate structure on the substrate, the two reference structures having substantially parallel edges defining a test region having a length and width;
    (b) concurrently implanting lightly-doped drain regions self-aligned with the ends of the gate structure and implanting a dopant in the test area using a first implant dosage;
    (c) forming spacers extending laterally from the ends of the gate structure and from the reference structures;
    (d) optically determining that the spacers have the selected width by detecting that the spacers fill the region between the reference structures;
    (e) concurrently implanting source and drain regions self-aligned with the spacers in selected portions of the lightly-doped regions and implanting a dopant in the test area using the spacers as masks using a second implant dosage greater than the first implant dosage;
    (f) electrically detecting the width of the spacers, by:
        (i) measuring the sheet resistance $R_{sN}-$ of the substrate de to the first implant dosage,
        (ii) measuring the sheet resistance $R_{sN}+$ of the substrate due to the combination of the first and second implant dosages,
        (iii) measuring the resistance R of the test region, and
        (iv) calculating the width of the spacers and thus the lightly-doped drain regions based upon the measured resistance values; and
    (g) characteristics the electrical performance of the field effect transistor based on the width of the spacers detected in said step (f).

2. A method according to claim 1, wherein said step (c) comprises the sub-steps of:
    (i) depositing a layer of spacer material over the reference structures and the gate structure;
    (ii) etching the layer of spacer material to remove the spacer material in a manner which creates the spacers.

3. A method according to claim 2, wherein said sub-step (c)(i) comprises depositing a silicon oxide spacer material layer.

4. A process as in claim 3, wherein the insulator layer is deposited by chemical vapor deposition.

5. A method according to claim 3, wherein said sub-step (c)(ii) comprises etching the spacer material layer by reactive ion etching.

6. A method according to claim 2, wherein said step (a) comprises forming the reference structures and the gate structure using the same process steps.

7. A method according to claim 2, wherein said step (f)(iv) comprises calculating width X of the spacers in accordance with the following relationship:

$$X = \tfrac{1}{2}\left(\frac{(R_{sN}-)}{(R_{sN}+) - (R_{sN}-)}\right)\left\{\left[\frac{L(R_{sN}+)}{R}\right] - (W + \Delta CD)\right\}$$

where W is the width of the test region, L is the length of the test region, and $\Delta CD$ is the measured variation in the width of the test region.

8. A method of fabricating, in a substrate, a field effect transistor having lightly-doped drain regions a selected width, comprising the steps of:
   (a) forming a pair of reference structures on the substrate to define a test region having a width W and a length L between the reference structures and forming a gate structure on the substrate;
   (b) concurrently implanting lightly-doped drain regions self-aligned with the ends of the gate structure and implanting a dopant in the test area using a first implant dosage;
   (c) forming spacers laterally extending a width X from the ends of the gate structure and from the reference structures;
   (d) concurrently implanting source and drain regions self-aligned with the spacers in selected portions of the lightly-doped regions and implanting a dopant in the test area using the spacers as masks using a second implant dosage greater than the first implant dosage;
   (e) electrically detecting the width X of the spacers, by:
      (i) measuring the sheet resistance $R_{sN}-$ of the substrate due to the first implant dosage,
      (ii) measuring the sheet resistance $R_{sN}+$ of the substrate due to the combination of the first and second implant dosages,
      (iii) measuring the resistance R of the test region, and
      (iv) calculating the width X of the spacers in accordance with the relationship $$X = \frac{1}{2} \left( \frac{(R_{sN}-)}{(R_{sN}+) - (R_{sN}-)} \right) \left\{ \left[ \frac{L(R_{sN}+)}{R} \right] - (W + \Delta CD) \right\}$$

where $\Delta CD$ is the measured variation in the width of the test region; and
   (f) characterizing the electrical performance of the field effect transistor based on the width of the spacers detected in said step (e).

9. A method of fabricating, in a substrate, a field effect transistor including lightly-doped drain regions having a selected width, in a first fabrication run, comprising the steps of:
   (a) providing a first pair of reference structures separated by a reference structure distance of approximately twice the selected width on the substrate, and a second pair of reference structures having substantially parallel edges defining a test region having a length and width;
   (b) providing a gate structure on the substrate;
   (c) concurrently implanting lightly-doped drain regions self-aligned with the ends of the gate structure and implanting a dopant in the test area using a first implant dosage;
   (d) forming spacers extending laterally from the ends of the gate structure and from each of the reference structures;
   (e) optically determining that the spacers have a width approximately one half of the distance between the first pair of reference structures by detecting that spacers extending from the first pair of reference structures fill the region between the first pair of reference structures;
   (f) concurrently implanting source and drain regions self-aligned with the spacers in selected portions of the lightly-doped regions and implanting a dopant in the test area using the spacers as masks using a second implant dosage greater than the first implant dosage;
   (g) electrically detecting the width of the lightly doped regions after said step (f), by:
      (i) measuring the sheet resistance $R_{sN}-$ of the substrate due to the first implant dosage,
      (ii) measuring the sheet resistance $R_{sN}+$ of the substrate due to the combination of the first and second implant dosages,
      (iii) measuring the resistance R of the test region, and
      (iv) calculating the width of the lightly-doped drain regions based upon the measured resistance values;
   (h) comparing the selected width and the width of the lightly-doped regions detected in said step (g) and determining an adjusted reference structure distance in accordance with the comparison; and
   (i) performing a second fabrication run comprising said steps (a) through (f) using the adjusted reference structure distance as the distance between the first pair of reference structures.

10. A method according to claim 9, wherein said step (c) comprises the sub-steps of:
   (i) depositing a layer of spacer material over the reference structures and the gate structure;
   (ii) etching the layer of spacer material to remove the spacer material in a manner which creates the spacers.

11. A method according to claim 10, wherein said sub-step (c)(i) comprises depositing a silicon oxide spacer material layer.

12. A method according to claim 9, wherein said step (a) comprises forming the reference structures and the gate structure using the same process steps.

13. A method according to claim 9, wherein said step (f)(iv) comprises calculating width X of the lightly-doped regions in accordance with the following relationship:

$$X = \frac{1}{2} \left( \frac{(R_{sN}-)}{(R_{sN}+) - (R_{sN}-)} \right) \left\{ \left[ \frac{L(R_{sN}+)}{R} \right] - (W + \Delta CD) \right\}$$

where W is the width of the test region, L is the length of the test region, and $\Delta CD$ is the measured variation in the width of the test region.

14. A method of fabricating, in a substrate, a field effect transistor including lightly-doped drain regions having a selected width, in a first fabrication run, comprising the steps of:
   (a) forming a pair of reference structures on the substrate to define a test region having a width W and a length L between the reference structures and forming a gate structure on the substrate;
   (b) concurrently implanting lightly-doped drain regions self-aligned with the ends of the gate structure and implanting a dopant in the test area using a first implant dosage;

(c) forming spacers laterally extending a width Y from the ends of the gate structure and from the reference structures;

(d) concurrently implanting source and drain regions self-aligned with the spacers in selected portions of the light-doped regions and implanting a dopant in the test area using the spacers as masks using a second implant dosage greater than the first implant dosage;

(e) electrically detecting the width X of the lightly-doped regions, by:
(i) measuring the sheet resistance $R_{sN}-$ of the substrate due to the first implant dosage,
(II) measuring the sheet resistance $R_{sN}+$ of the substrate due to the combination of the first and second implant dosages,
(iii) measuring the resistance R of the test region, and
(iv) calculating the width X of the lightly-doped regions in accordance with the relationship $$X = \frac{1}{2}\left(\frac{(R_{sN}-)}{(R_{sN}+) - (R_{sN}-)}\right)\left(\left[\frac{L(R_{sN}+)}{R}\right] - (W + \Delta CD)\right)$$

where $\Delta CD$ is the measured variation in the width of the test regions; and (f) comparing the width X and the width Y to adjust the width Y for a second fabrication run.

15. A process of fabricating field effect transistors including light-doped drain regions of a target width (LDD FETs), comprising the steps of:
(a) forming a first LDD FET by:
(i) forming a pair of reference structures separated by a distance of twice the target width on the substrate and forming a gate structure on the substrate, the two reference structures having substantially parallel edges defining a test region having a length and width,
(ii) concurrently implanting lightly-doped drain regions self-aligned with the ends of the gate structure and implanting a dopant in the test area using a first implant dosage,
(iii) forming spacers extending laterally from the ends of the gate structure and from the reference structures,
(iv) optically determining that the spacers have a width which is approximately one half of the distance between the reference structures by detecting that the spacers fill the region between the reference structures,
(v) concurrently implanting source and drain regions self-aligned with the spacers in selected portions of the lightly-doped regions and implanting a dopant in the test area using the spacers as masks using a second implant dosage greater than the first implant dosage; and
(b) detecting the width of the lightly-doped drain regions by:
(i) measuring the sheet resistance $R_{sN}-$ of the substrate due to the first implant dosage,
(ii) measuring the sheet resistance $R_{sN}+$ of the substrate due to the combination of the first and second implant dosages,
(iii) measuring the resistance R of the test region, and
(c) forming a second LDD FET utilizing spacers having a spacer width determined by comparing the target width and the width determined in said step (b).

16. A process according to claim 15, wherein said step (c) comprises the sub steps of:
(i) comparing the target width and the width of the lightly-doped regions calculated in said step (b) to establish a relationship between the target width and the width calculated in said step (b);
(ii) selecting a spacer width in accordance with the relationship established in said sub-step (c)(i); and
(iii) forming a second LDD FET utilizing spacers having the spacer width established in said step sub-step (c)(ii).

17. A process of fabricating, in a substrate, a field effect transistor having lightly-doped drain regions of a selected width, comprising the steps of:
(a) providing a gate structure overlying the substrate;
(b) forming lightly-doped drain regions self-aligned with the ends of the gate structure in the substrate;
(c) providing a layer of spacer material overlying the substrate;
(d) etching the layer of spacer material for a selected time to form spacers extending laterally from the ends of the gate structure;
(e) forming source and drain regions self-aligned with the spacers in selected portions of the lightly-doped drain regions;
(f) determining the width of the lightly-doped regions after said step (e) by:
(i) measuring the sheet resistance $R_{sN}-$ of the substrate due to the first implant dosage,
(ii) measuring the sheet resistance $R_{sN}+$ of the substrate due to the combination of the first and second implant dosages,
(iii) measuring the resistance R of the test region, and
(iv) calculating the width of the spacers and thus the lightly-doped drain regions based upon the measured resistance values;
(g) comparing the selected width with the width determined in said step (f) and determining an adjusted etching time in accordance with the comparison;
(h) repeating said steps (a) through (e) using the adjusted etching time as the selected time in said step (d).

18. A process according to claim 17, further comprising the steps of:
(i) providing a pair of reference structures on the substrate, the two reference structures having substantially parallel edges defining a test region having a length L and width W prior to said step (c);
wherein said step (f)(iv) comprises calculating the width X of the lightly-doped regions in accordance with the relationship $$X = \frac{1}{2}\left(\frac{(R_{sN}-)}{(R_{sN}+) - (R_{sN}-)}\right)\left(\left[\frac{L(R_{sN}+)}{R}\right] - (W + \Delta CD)\right)$$

where $\Delta CD$ is the measured variation in the width of the test region.

19. A method of fabricating, in a substrate, a field effect transistor including lightly-doped drain regions having a selected width, comprising the steps of:
(a) forming a pair of reference structures separated by a distance of twice the selected width on the substrate and forming a gate structure on the substrate, the two reference structures having substantially parallel edges defining a test region having a length and width;

(b) concurrently implanting lightly-doped drain regions self-aligned with the ends of the gate structure and implanting a dopant in the test area using a first implant dosage;

(c) forming spacers extending laterally from the ends of the gate structure and from the reference structures;

(d) optically determining that the spacers have the selected width by detecting that the spacers fill the region between the reference structures;

(e) concurrently implanting source and drain regions self-aligned with the spacers in selected portions of the lightly-doped regions and implanting a dopant in the test area using the spacers as masks using a second implant dosage greater than the first implant dosage;

(f) electrically determining the width of the spacers, by:

(i) measuring the sheet resistance $R_{sN}-$ of the substrate due to the first implant dosage, (ii) measuring the sheet resistance $R_{sN}+$ of the substrate due to the combination of the first and second implant dosages, (iii) measuring the resistance R of the test region, and (iv) calculating the width of the spacers and thus the lightly-doped drain regions based upon the measured resistance values; and (g) characterizing the reliability of the field effect transistor based on the width of the spacers determined in said step (f).

20. A method according to claim 19, wherein said step (f)(iv) comprises calculating width X of the spacers in accordance with the following relationship:

$$X = \frac{1}{2}\left\{ \frac{(R_{sN}-)}{(R_{sN}+) - (R_{sN}-)} \right\} \left\{ \left[ \frac{L(R_{sN}+)}{R} \right] - (W + \Delta CD) \right\}$$

where W is the width of the test region, L is the length of the test region, and $\Delta CD$ is the measured variation in the width of the test region.

* * * * *